United States Patent
Yan

(10) Patent No.: US 11,532,246 B2
(45) Date of Patent: Dec. 20, 2022

(54) FLEXIBLE DISPLAY MODULE AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Ying Yan, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 218 days.

(21) Appl. No.: 16/756,173

(22) PCT Filed: Mar. 25, 2020

(86) PCT No.: PCT/CN2020/081114
§ 371 (c)(1),
(2) Date: Apr. 15, 2020

(87) PCT Pub. No.: WO2021/159590
PCT Pub. Date: Aug. 19, 2021

(65) Prior Publication Data
US 2021/0407337 A1 Dec. 30, 2021

(30) Foreign Application Priority Data
Feb. 11, 2020 (CN) .......................... 202010086743.0

(51) Int. Cl.
*G09F 9/30* (2006.01)
*G09G 3/3225* (2016.01)
(Continued)

(52) U.S. Cl.
CPC ........... *G09F 9/301* (2013.01); *G09G 3/3225* (2013.01); *H01L 27/3225* (2013.01); *H01L 27/3244* (2013.01); *H01L 51/0097* (2013.01)

(58) Field of Classification Search
CPC ... G09F 9/301; G09G 3/3225; H01L 27/3225; H01L 27/3244; H01L 51/0097; H01L 27/3248
See application file for complete search history.

(56) References Cited

U.S. PATENT DOCUMENTS

2015/0301672 A1  10/2015  Kim et al.
2019/0302885 A1  10/2019  Sharma et al.

FOREIGN PATENT DOCUMENTS

CN  101425264 A  5/2009
CN  105047085 A  11/2015
(Continued)

Primary Examiner — Ermias T Woldegeorgis
(74) Attorney, Agent, or Firm — Dickinson Wright PLLC

(57) ABSTRACT

The present disclosure provides a flexible display module and a display device. The flexible display module includes a flexible display panel and a driving chip, and the flexible display panel includes a flexible substrate, a driving circuit layer, and a light-emitting functional layer which are sequentially disposed. The driving circuit layer includes a piezoelectric layer. The piezoelectric layer can convert stress generated when the display panel is bent into an electrical signal, which is transmitted to the driving chip through the driving circuit and controls each area of the flexible display panel to emit light of a predetermined intensity.

17 Claims, 5 Drawing Sheets

(51) Int. Cl.
*H01L 27/32* (2006.01)
*H01L 51/00* (2006.01)

(56) References Cited

FOREIGN PATENT DOCUMENTS

| | | | |
|---|---|---|---|
| CN | 108010948 A | 5/2018 | |
| CN | 108364602 A | 8/2018 | |
| CN | 108447433 A | 8/2018 | |
| WO | WO-2018120692 A1 * | 7/2018 | ......... G01S 15/8925 |
| WO | WO-2020113908 A1 * | 6/2020 | ........... G09G 3/3266 |

* cited by examiner

US 11,532,246 B2

FLEXIBLE DISPLAY MODULE AND DISPLAY DEVICE

FIELD OF INVENTION

The present disclosure relates to the field of display technologies, and more particularly, to a flexible display module and a display device.

BACKGROUND OF INVENTION

Flexible display panels have become a new generation of display technologies due to their flexibility, bendability, and ease of wear. However, currently, when a flexible display substrate is bent, a pixel aperture ratio of a display panel screen changes, resulting in different light emission rates in different areas of the screen, which in turn causes visual discomfort.

Therefore, a problem of existing flexible display panels having uneven screen brightness when bent needs to be solved.

SUMMARY OF INVENTION

The present disclosure provides a flexible display module and a display device, which effectively alleviates the problem of uneven brightness of the screen when the current flexible display panel is bent.

In first aspect, one embodiment of the present disclosure provides a flexible display module includes a flexible display panel and a driving chip bonded in the flexible display panel, the flexible display panel including:
a flexible substrate;
a driving circuit layer disposed on the flexible substrate and provided with a plurality of driving circuit corresponding to each of pixels;
a light-emitting functional layer disposed on a side of the driving circuit layer away from the flexible substrate and provided with a plurality of light-emitting unit of the pixels; and
a piezoelectric layer provided between the flexible substrate and the light-emitting functional layer, connected to the driving chip, and configured to convert a stress generated by bending the flexible display panel into a pressure electrical signal and transmit the pressure electrical signal to the driving chip;
wherein the driving chip is configured to determine a bending state of the flexible display panel according to the pressure electrical signal, and control a plurality of areas of the flexible display panel to emit light in predetermined intensity according to the bending state of the flexible display panel.

In the flexible display module provided in the present disclosure, the driving circuit layer comprises a buffer layer, an active layer, a first gate insulating layer, a first metal layer, a second gate insulating layer, a second metal layer, a passivation layer, and a source-drain layer disposed sequentially; and the piezoelectric layer is provided in the driving circuit layer.

In the flexible display module provided in the present disclosure, the piezoelectric layer is provided between the active layer and the first gate insulating layer.

In the flexible display module provided in the present disclosure, the piezoelectric layer is provided between the buffer layer and the active layer.

In the flexible display module provided in the present disclosure, the piezoelectric layer is provided between the driving circuit layer and the light-emitting functional layer.

In the flexible display module provided in the present disclosure, the piezoelectric layer is provided between the flexible substrate and the driving circuit layer.

In the flexible display module provided in the present disclosure, a material of the piezoelectric layer is a polymer material.

In the flexible display module provided in the present disclosure, a material of the piezoelectric layer is a composite material of a polymer material and a metal material.

In the flexible display module provided in the present disclosure, the metal material is a metal polymer.

According to second aspect, one embodiment of the present disclosure further provides a display device comprises a flexible display module includes a flexible display panel and a driving chip bonded in the flexible display panel, the flexible display panel including:
a flexible substrate;
a driving circuit layer disposed on the flexible substrate and provided with a plurality of driving circuit corresponding to each of pixels;
a light-emitting functional layer disposed on a side of the driving circuit layer away from the flexible substrate and provided with a plurality of light-emitting unit of the pixels; and
a piezoelectric layer provided between the flexible substrate and the light-emitting functional layer, connected to the driving chip, and configured to convert a stress generated by bending the flexible display panel into a pressure electrical signal and transmit the pressure electrical signal to the driving chip;
wherein the driving chip is configured to determine a bending state of the flexible display panel according to the pressure electrical signal, and control a plurality of areas of the flexible display panel to emit light in predetermined intensity according to the bending state of the flexible display panel.

In the display device provided by the present disclosure, the driving circuit layer comprises a buffer layer, an active layer, a first gate insulating layer, a first metal layer, a second gate insulating layer, a second metal layer, a passivation layer, and a source-drain layer disposed sequentially; and the piezoelectric layer is provided in the driving circuit layer.

In the display device provided by the present disclosure, the piezoelectric layer is provided between the active layer and the first gate insulating layer.

In the display device provided in the present disclosure, the piezoelectric layer is provided between the buffer layer and the active layer.

In the display device provided by the present disclosure, the piezoelectric layer is provided between the driving circuit layer and the light-emitting functional layer.

In the display device provided by the present disclosure, the piezoelectric layer is provided between the flexible substrate and the driving circuit layer.

In the display device provided by the present disclosure, a material of the piezoelectric layer is a polymer material.

In the display device provided in the present disclosure, a material of the piezoelectric layer is a composite material of a polymer material and a metal material.

In the display device provided in the present disclosure, the metal material is a metal polymer.

In the display device provided in the present disclosure, the piezoelectric layer comprises at least one piezoelectric film.

In the display device provided by the present disclosure, a thickness of the piezoelectric layer is in a range from 10 nanometers to 20 micrometers.

The present disclosure provides a flexible display module and a display device. The flexible display module includes a flexible display panel and a driving chip, and the flexible display panel includes a flexible substrate, a driving circuit layer, and a light-emitting functional layer which are sequentially disposed. The driving circuit layer includes a piezoelectric layer. The piezoelectric layer can convert stress generated when the display panel is bent into an electrical signal, which is transmitted to the driving chip through a driving circuit and controls each area of the flexible display panel to emit light of a predetermined intensity, thereby alleviating a problem of uneven brightness when bending the display panel.

DETAILED DESCRIPTION OF PREFERRED EMBODIMENTS

Figure 1:
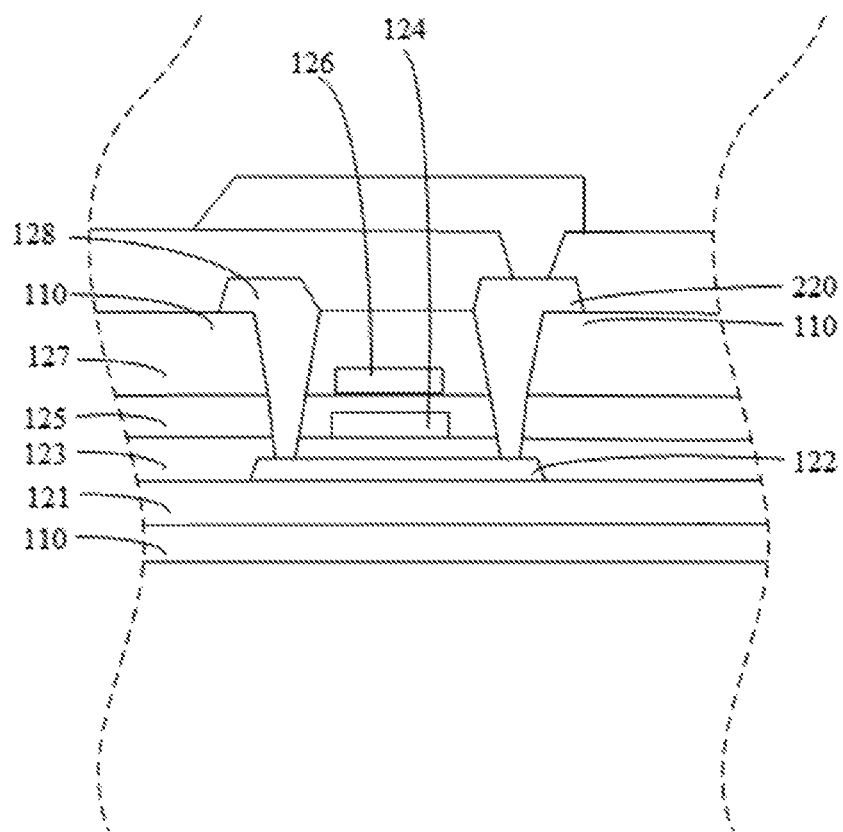
FIG. 1 is a schematic structural diagram of a conventional flexible display panel.

In the following, the technical solutions in the embodiments of the present disclosure will be clearly and completely described with reference to the figures. Obviously, the described embodiments are only some embodiments of the present disclosure, not all the embodiments. Based on the embodiments in the present disclosure, all other embodiments obtained by a person of ordinary skill in the art without creative steps shall fall within the protection scope of the present disclosure.

In the description of the present disclosure, it should be understood that the terms of center, longitudinal, transverse, length, width, thickness, upper, lower, front, rear, left, right, vertical, horizontal, top, bottom, inside, outside, clockwise, counterclockwise, etc. or a positional relationship based on orientation or position shown in the figures are only for the convenience of describing the present disclosure and simplifying the description, rather than indicating or implying the device or element referred to must have a specific orientation, structure, or operation. Therefore, it cannot be understood as a limitation of the present disclosure.

In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present disclosure, the meaning of "a plurality" is two or more, unless specifically defined otherwise.

In the description of the present disclosure, it should be noted that the terms "installation", "linked", and "connected" should be understood in a broad sense unless explicitly stated and limited otherwise. For example, it can be fixed connection, removable connection, or integral connection; it can be mechanical or electrical connection; it can be directly connected, indirectly connected through an intermediate medium, or it can be an internal communication of two elements. For those of ordinary skill in the art, the specific meanings of the above terms in the present disclosure can be understood on a case-by-case basis.

In the present application, unless explicitly specified and defined otherwise, a first feature being "on" or "under" a second feature may be that the first feature and the second feature are in direct contact, or the first feature and the second feature are in indirect contact through an intermediary. In addition, the first feature being "on", "over" and "above" the second feature may be that the first feature is just above or diagonally above the second feature, or merely represents that a horizontal height of the first feature is higher than that of the second feature. The first feature being "under", "below" and "underneath" the second feature may be that the first feature is just below or diagonally below the second feature, or merely represents that the horizontal height of the first feature is lower than that of the second feature.

The following disclosure provides many different implementations or examples for implementing different structures of the present disclosure. To simplify the disclosure of the present disclosure, the components and settings of specific embodiments are described below. Of course, they are merely embodiments and are not intended to limit the present disclosure. In addition, the present disclosure may repeat reference numbers and/or reference letters in different embodiments, and such repetition is for simplicity and clarity and does not indicate the relationship between the various embodiments and/or settings discussed. In addition, embodiments of various specific processes and materials are provided in the present disclosure, but those of ordinary skill in the art may be aware of the application of other processes and/or the use of other materials.

To alleviate a problem of uneven brightness when bending the display panel, the present disclosure provides a flexible display module and a display device.

The flexible display module of the present disclosure includes a flexible display panel and a driving chip bound to the flexible display panel. The flexible display panel includes a flexible substrate, a driving circuit layer, and a light-emitting functional layer. The driving circuit layer is formed on the flexible substrate. The light-emitting functional layer is provided on a side of the driving circuit layer away from the flexible substrate. A piezoelectric layer is provided between the flexible substrate and the light-emitting functional layer, and is connected to a driving circuit and configured to convert stress generated by bending the flexible display panel into an electrical signal, which is transmitted to the driving chip through the driving circuit. The driving chip is configured to determine a bending state of the flexible display panel according to the electrical signal, and control a plurality of areas of the flexible display panel to emit light of predetermined intensity according to the bending state of the flexible display panel.

As shown in FIG. 1, FIG. 1 is a schematic structural diagram of a conventional flexible display panel, which sequentially includes a substrate 110, a driving function layer 120, and a light-emitting function layer 130. The driving function layer 120 includes a buffer layer 121, an active layer 122, a first gate insulating layer 123, a first metal layer 124, a second gate insulating layer 125, a second metal layer 126, a passivation layer 127, and a source-drain layer 128. The active layer 122 is provided on a side of the substrate 110 and is patterned to form a channel region and a doped region. The first metal layer 124 is provided on a side of the first gate insulating layer 123 away from the substrate 110 and is patterned to form a first gate. The second metal layer 126 is provided on a side of the second gate insulating layer 125 away from the active layer. The passivation layer 127 is provided on a side of the second metal layer 126 away from the first metal layer 124. The source-drain layer 128 is provided on a side of the passivation layer 127 away from the second metal layer and is patterned to form a source and a drain.

The substrate 110 is a flexible substrate. The flexible substrate is usually provided to increase the flexibility of the display panel, and is usually a single-layer flexible material or a flexible material laminated structure. The present disclosure does not limit the structures of the substrate.

The buffer layer 121 is formed on one side of the substrate 110. The buffer layer may be an inorganic material such as a silicon oxide or a silicon nitride, and is used to block water and oxygen intrusion.

The active layer 122 is formed on the buffer layer 121. A material of the active layer 122 is a metal oxide which selected from a group consisting of indium gallium zinc oxide (IGZO), aluminum zinc oxide (AZO), indium zinc oxide (IZO), zinc oxide (ZnO), indium oxide (In2O3), boron-doped zinc oxide (BZO), and magnesium-doped zinc oxide (MZO). Moreover, the active layer 122 may also include a polysilicon material or other materials.

The first gate insulating layer 123 is formed on the active layer. A material of the first gate insulating layer 123 may be an inorganic material such as silicon oxide or silicon nitride, and may be developed or etched by sputtering, thermal evaporation, or chemical vapor deposition.

The first metal layer 124 is formed on the first gate insulating layer 123. A material of the first metal layer 124 may be molybdenum, aluminum, or copper, but is not limited thereto, and may also be chromium, tungsten, titanium, tantalum, or alloys thereof, or other materials. The first metal layer 124 is patterned through an etching process to form the first gate.

The second gate insulating layer 125 is formed on the first metal layer 124. A material of the second gate insulating layer includes inorganic materials such as silicon oxide or silicon nitride, and is developed or etched by sputtering, thermal evaporation, or chemical vapor deposition.

The second metal layer 126 is formed on the second gate insulating layer 125. A material of the second metal layer includes molybdenum, aluminum, or copper, but is not limited thereto, and may also be chromium, tungsten, titanium, tantalum, or alloys thereof, or other materials. The second metal layer is patterned to form the second gate.

The interlayer dielectric layer 127 is formed on the second metal layer 126. A material of the passivation layer (interlayer dielectric layer) may be inorganic materials such as silicon oxide or silicon nitride.

The source-drain layer 128 is formed on the interlayer dielectric layer 127. A material of the source-drain layer 128 may be molybdenum, aluminum, or copper, but is not limited thereto, and may also be chromium, tungsten, titanium, tantalum, or alloys thereof, or other materials. The source-drain layer 128 is patterned by an etching process to form a source and a drain of each thin-film transistor, data lines, and shared electrode lines. The drains of each of a plurality of thin-film transistors in the sub-pixels of a same row are connected to the data lines in the left and right columns of the sub-pixels.

The planarization layer is formed on the source-drain layer 128, and a material of the planarization layer may be silicon carbide, which is formed on the source-drain layer by a chemical vapor method.

The driving circuit layer 130 includes a pixel electrode layer; the pixel electrode layer is formed on the planarization layer and is connected to the source-drain layer 128 through a via hole. The pixel electrode layer is patterned to form a pixel electrode and a common electrode line.

The light emitting functional layer includes an organic light emitting layer, which can include a combination of one or more of a light emitting layer, a hole injection layer, a hole transport layer, an electron blocking layer, a hole blocking layer, an electron transport layer, and an electron injection layer.

In the present disclosure, a piezoelectric layer 129 is further formed between the driving circuit layer and the light-emitting functional layer.

The piezoelectric layer 129 is a thin-film layer made of a material having a positive piezoelectric effect. Generally, a material of the piezoelectric layer is selected from a group consisting of polyvinylidene fluoride, a polymer material containing an epoxy resin matrix, a polymer material containing a polyvinyl chloride matrix, a polymer material containing a polyurethane matrix, or a material containing a silicone polymer matrix. The polymer material containing the epoxy resin matrix includes a polymer compound containing a basic functional group of an epoxy resin, the polymer material containing the polyvinyl chloride matrix includes a polymer compound containing a functional group of a polyvinyl chloride, the polymer material containing a polyurethane matrix includes a polymer compound containing a basic functional group of polyurethane, and the material containing a silicone polymer matrix includes a polymer containing a silicon element in a molecular structure and an organic functional group connected to a silicon atom.

In some embodiments, in addition to the materials with positive piezoelectric effect, the positive piezoelectric material can also be made into a positive piezoelectric thin-film material with other organic materials (such as polyimide, etc.).

In some embodiments, the positive piezoelectric thin-film layer adopts polyvinylidene fluoride, so as to have the characteristics of a fluororesin and a general-purpose resin. The piezoelectric layer 129 provided by using the thin-film layer has good high temperature resistance characteristics in addition to the positive piezoelectric effect. At the same time, the piezoelectric layer 129 can be provided into a thin-film to form a micron-thick film layer. Therefore, the positive piezoelectric film layer having a transparent effect can be manufactured. This can not only improve the brightness of the flexible display panel, but can also be used to manufacture a transparent flexible display panel. The piezoelectric layer is usually deposited by one or more of laser beam evaporation method, alternating field spraying method, metal organic meteorological epitaxy method, and sol-gel method. In some embodiments, a thickness of the piezoelectric layer ranges from 10 to 60 microns.

In some embodiments, the piezoelectric material may also be a composite material of a polymer and a metal to form a piezoelectric ceramic. The metal material is doped in the piezoelectric material in the form of a metal polymer, and the metal polymer is selected from a group consisting of barium titanate, lead titanate, and lead metaniobate. When pressure is applied to a ceramic crystal without a center of symmetry, a surface charge of the crystal loses its restraint and becomes apparent to the outside, so that the pressure on the piezoelectric layer 129 can be reflected according to a magnitude of the electricity.

In some embodiments, the piezoelectric layer material is a polymer material, and the polymer material is selected from a group consisting of lead zirconate titanate, aluminum nitride, vinyl fluoride, polyvinylidene fluoride, and trifluoroethylene copolymer; at the same time, a metal material forms a light-shielding layer on one side of the piezoelectric layer, and the metal material is metal silicide.

In some embodiments, a thickness of the piezoelectric layer ranges from 10 μm to 60 μm, and a thickness of the light shielding layer ranges from 5 nm to 20 μm.

When the flexible display panel is bent, the piezoelectric layer 129 converts the stress generated by the deformation into electrical energy. On the one hand, as the piezoelectric layer can convert the stress into electrical energy, it can release the stress generated by the deformation, which helps to reduce the internal stress of the flexible display panel; on the other hand, when the panel is bent, the force at the bend is different from that at the plane, so a magnitude of the electrical signal generated by the piezoelectric material is also different. The magnitude of the electrical signal reflects a magnitude of the force of the piezoelectric material, and the piezoelectric material is connected to the driver chip. The driver chip judges the degree of bending of the display panel by sensing the magnitude of the electrical signal at different positions, thereby adjusting the screen brightness and making the display panel emit light of predetermined intensity to achieve uniform screen brightness when the display panel is bent.

The flexible display module of the present disclosure will be further explained with reference to specific embodiments.

Figure 2:
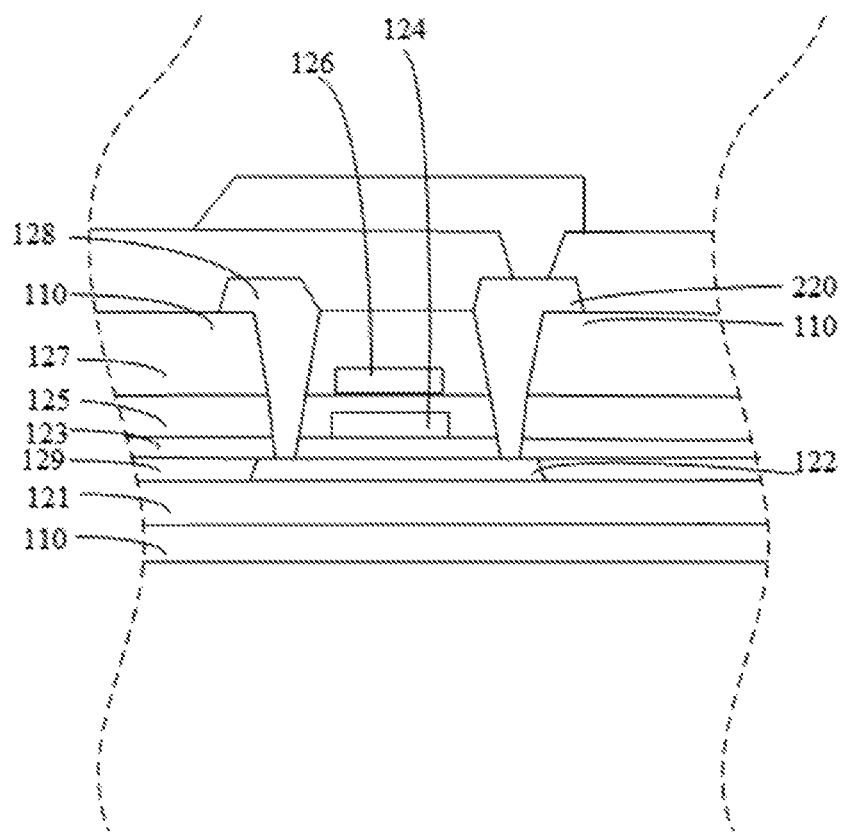
FIG. 2 is a schematic structural diagram of a first flexible display panel according to one embodiment of the present disclosure.

In some embodiments, as shown in FIG. 2, the piezoelectric layer 129 is provided between the active layer 122 and the first gate insulating layer.

In the prior art, the bending of the display panel easily causes the pixel aperture ratio of the display panel to change, resulting in different light emission rates in different areas of the screen, which affect uniformity of brightness of the display panel. Since the piezoelectric layer 129 can be forced to generate an electrical signal, the electrical signal can reflect the degree of bending of the display panel. A functional relationship is first established according to the electrical signal generated when the piezoelectric layer 129 is bent and the aperture ratio of the pixel, and then a compensation algorithm for each pixel is obtained according to the functional relationship and the preset brightness of the display panel. The compensation algorithm is used to compensate the brightness of the display panel in the bent area, forming uniformity of screen brightness. The predetermined brightness of the display panel, the functional relationship between the electrical signal generated by the piezoelectric layer and the pixel aperture ratio, and the pixel compensation algorithm are all saved in the driving chip.

In some embodiments, the display panel is bent to generate an electrical signal in the piezoelectric layer. After the electrical signal is transmitted to the driving chip, the driving chip determines an aperture ratio of the pixel in the bending area of the display panel according to a preset function relationship, thereby activating the compensation algorithm to compensate brightness of the pixels in the bending area of the display panel.

Figure 3:
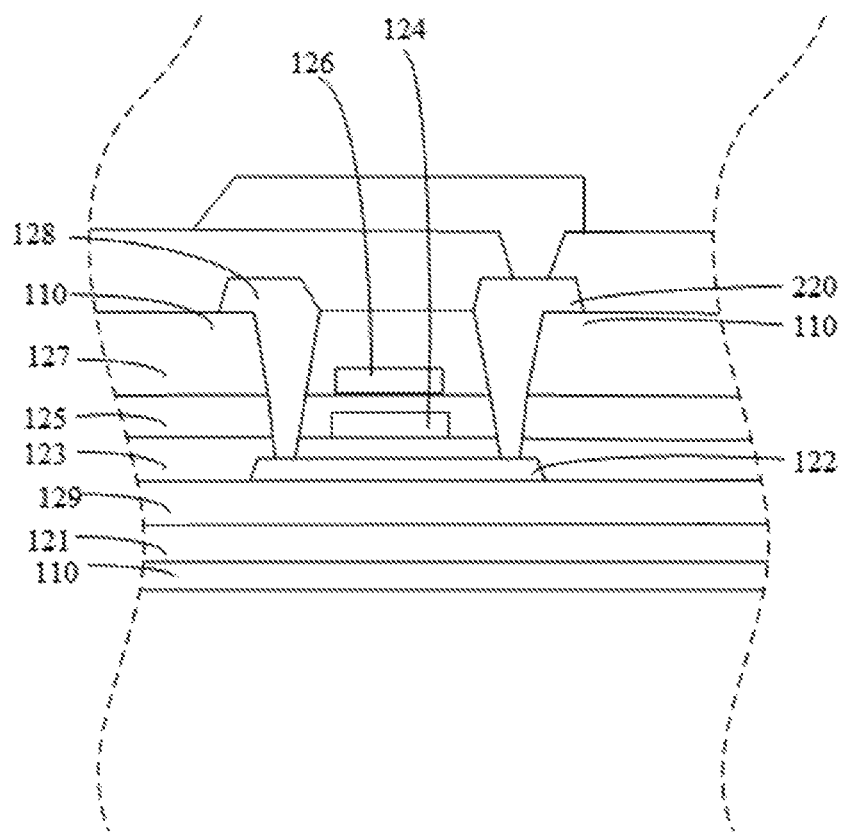
FIG. 3 is a schematic structural diagram of a second flexible display panel according to one embodiment of the present disclosure.

In some embodiments, as shown in FIG. 3, the piezoelectric layer is provided between the buffer layer and the active layer.

Figure 4:
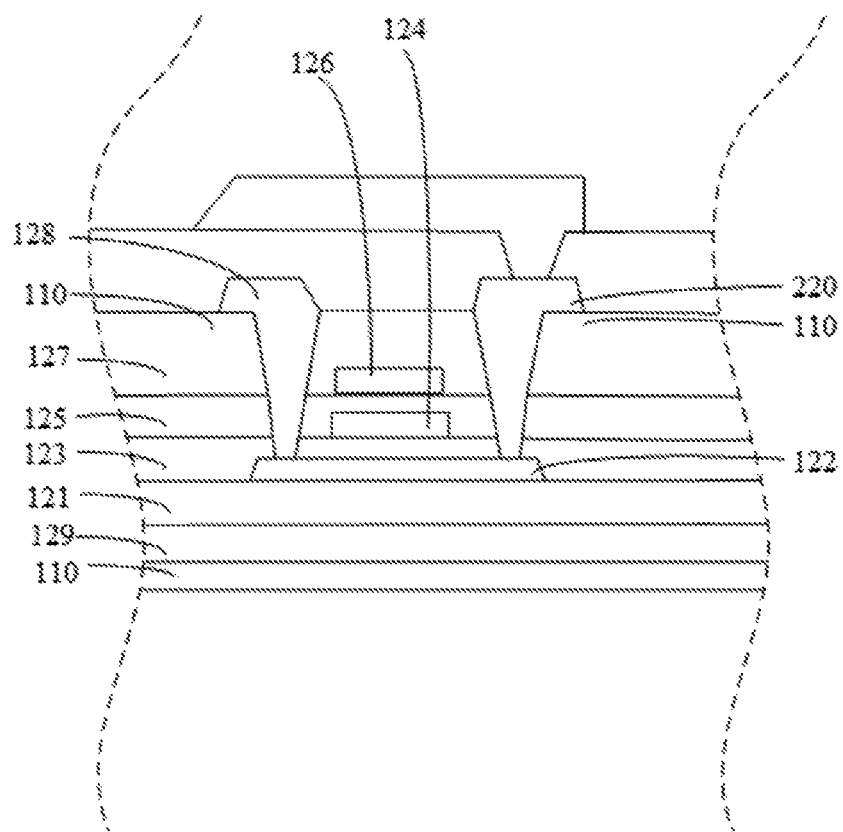
FIG. 4 is a schematic structural diagram of a third flexible display panel according to one embodiment of the present disclosure.

In some embodiments, as shown in FIG. 4, the piezoelectric layer is provided between the driving circuit layer and the light-emitting functional layer.

In some embodiments, the piezoelectric layer is provided between the flexible substrate and the driving circuit layer.

Figure 5:
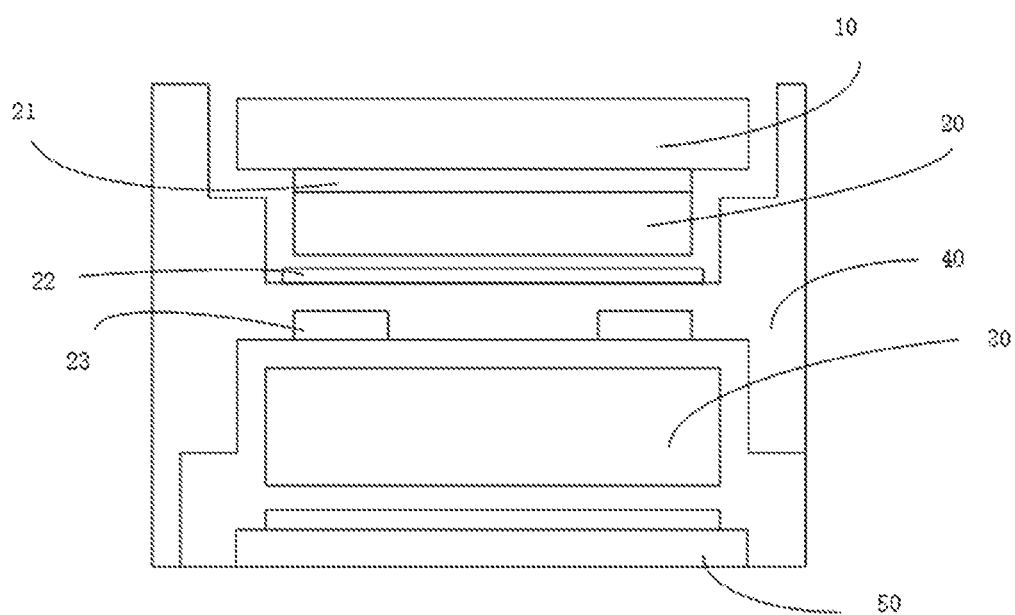
FIG. 5 is a schematic structural diagram of a display device according to one embodiment of the present disclosure.

At the same time, the present disclosure also provides a display device. As shown in FIG. 5, it is a schematic structural diagram of the display device according to one embodiment of the present disclosure. The display device includes a cover plate 10, a flexible display module 20, a battery 30, a middle frame 40, and a rear cover 50.

The cover plate 10 is a transparent material, usually a glass. The flexible display module 20 includes a display panel and a driving chip bound to the flexible display panel. The display panel is the above-mentioned flexible display panel. The driving chip is used to provide external driving signals and receive the electrical signals generated by the piezoelectric layer. The driver chip also saves a pixel preset brightness and a pixel compensation algorithm. The cover plate 10 is provided in the light emitting direction of the flexible display panel. The cover plate 10 and the display module 20 are bonded together through a first adhesive layer 21. A material of the first adhesive layer 21 is an optical adhesive. The display module 20 and the battery 30 are both provided in the middle frame 40 and sealed by the cover plate 10 and the rear cover 50. The battery 30 is provided below the display module 20 and provides electrical signals to the flexible display module 20 through the flexible circuit board 23. A buffer layer 22 is also provided between the flexible display module 20 and the middle frame 40. The buffer layer 22 is a foam. The foam protects the display panel and prevent the display panel from being damaged by vibration and impact with the middle frame 40 during use. The battery 30 and the middle frame 40 are bonded together by a second adhesive layer, and the second adhesive layer is usually a double-sided adhesive. A heat dissipation layer is provided between the battery 30 and the back cover 50. The heat dissipation layer is graphite. The graphite has good heat dissipation performance, which can prevent the battery 30 from overheating and affecting performance. The display device further includes a sounder and a connection terminal, and the sounder is connected to the display module through the connection terminal.

The flexible display module 20 includes a flexible substrate 110, a driving circuit layer 120, and a light-emitting functional layer 130. The driving circuit layer is formed on the flexible substrate, and the light-emitting functional layer is formed on one side of the driving circuit layer away from the flexible substrate.

The driving circuit layer further includes a buffer layer, an active layer, a first gate insulating layer, a first metal layer, a second gate insulating layer, a second metal layer, a passivation layer, and a source-drain layer, which are sequentially disposed. The piezoelectric layer is formed in a driving circuit layer, and the piezoelectric layer can convert the stress generated when the display panel is bent into an electrical signal and transmit it to the driving chip through the driving circuit.

In some embodiments, as shown in FIG. 2, the piezoelectric layer is provided between the active layer and the first gate insulating layer.

In some embodiments, as shown in FIG. 3, the piezoelectric layer is provided between the buffer layer and the active layer.

In some embodiments, as shown in FIG. 4, the piezoelectric layer is provided between the driving circuit layer and the light-emitting functional layer.

In some embodiments, the piezoelectric layer is provided between the flexible substrate and the driving circuit layer.

In some embodiments, the piezoelectric material is a polymer material, which may be selected from a group consisting of lead zirconate titanate, aluminum nitride, fluoroethylene, polyvinylidene fluoride, and trifluoroethylene copolymer.

In some embodiments, the piezoelectric layer is a composite material of a polymer material and a metal material, and the metal material is a metal polymer.

According to the foregoing embodiments, it is known that the flexible display module and display device provided in the embodiments of the present disclosure have been described in detail above. The description of the above embodiments is only used to help understand the technical solution and core idea of the present disclosure. It should be noted that, for those of ordinary skill in the art, without departing from the principle of the present disclosure, several improvements and retouches can be made, and these improvements and retouches are within the protection scope of the present disclosure.

What is claimed is:

1. A flexible display module, comprising a flexible display panel and a driving chip bonded to the flexible display panel, wherein the flexible display panel comprises:
   a flexible substrate;
   a driving circuit layer disposed on the flexible substrate and provided with a plurality of driving circuits corresponding to each pixel;
   a light-emitting functional layer disposed on a side of the driving circuit layer away from the flexible substrate and provided with a plurality of light-emitting units of the pixels; and
   a piezoelectric layer provided between the flexible substrate and the light-emitting functional layer, connected to the driving chip, and configured to convert stress generated by bending the flexible display panel into a pressure electrical signal and transmit the pressure electrical signal to the driving chip;
   wherein the driving chip is configured to determine a bending state of the flexible display panel according to the pressure electrical signal, and control a plurality of areas of the flexible display panel to emit light of predetermined intensity according to the bending state of the flexible display panel; and
   wherein the driving circuit layer comprises a buffer layer, an active layer, a first gate insulating layer, a first metal layer, a second gate insulating layer, a second metal layer, a passivation layer, and a source-drain layer disposed sequentially, and the piezoelectric layer is provided in the driving circuit layer.

2. The flexible display module as claimed in claim 1, wherein a material of the piezoelectric layer is a composite material of a polymer material and a metal material.

3. The flexible display module as claimed in claim 2, wherein the metal material is a metal polymer.

4. The flexible display module as claimed in claim 1, wherein the piezoelectric layer is provided between the active layer and the first gate insulating layer.

5. The flexible display module as claimed in claim 1, wherein the piezoelectric layer is provided between the buffer layer and the active layer.

6. The flexible display module as claimed in claim 1, wherein the piezoelectric layer is provided between the driving circuit layer and the light-emitting functional layer.

7. The flexible display module as claimed in claim 1, wherein a material of the piezoelectric layer is a polymer material.

8. A display device comprising a flexible display module, wherein the flexible display module comprises a flexible display panel and a driving chip bonded to the flexible display panel, and wherein the flexible display panel comprises:
   a flexible substrate;
   a driving circuit layer disposed on the flexible substrate and provided with a plurality of driving circuits corresponding to each pixel;
   a light-emitting functional layer disposed on a side of the driving circuit layer away from the flexible substrate and provided with a plurality of light-emitting units of the pixels; and
   a piezoelectric layer provided between the flexible substrate and the light-emitting functional layer, connected to the driving chip, and configured to convert a stress generated by bending the flexible display panel into a pressure electrical signal and transmit the pressure electrical signal to the driving chip;
   wherein the driving chip is configured to determine a bending state of the flexible display panel according to the pressure electrical signal, and control a plurality of areas of the flexible display panel to emit light of predetermined intensity according to the bending state of the flexible display panel; and
   wherein the piezoelectric layer is provided between the flexible substrate and the driving circuit layer.

9. The display device as claimed in claim 8, wherein the driving circuit layer comprises a buffer layer, an active layer, a first gate insulating layer, a first metal layer, a second gate insulating layer, a second metal layer, a passivation layer, and a source-drain layer disposed sequentially, and the piezoelectric layer is provided in the driving circuit layer.

10. The display device as claimed in claim 9, wherein the piezoelectric layer is provided between the active layer and the first gate insulating layer.

11. The display device as claimed in claim 9, wherein the piezoelectric layer is provided between the buffer layer and the active layer.

12. The display device as claimed in claim 9, wherein the piezoelectric layer comprises at least one piezoelectric film.

13. The display device as claimed in claim 9, wherein a thickness of the piezoelectric layer ranges from 10 nanometers to 20 micrometers.

14. The display device as claimed in claim 8, wherein a material of the piezoelectric layer is a composite material of a polymer material and a metal material.

15. The display device as claimed in claim 14, wherein the metal material is a metal polymer.

16. The display device as claimed in claim 8, wherein the piezoelectric layer is provided between the driving circuit layer and the light-emitting functional layer.

17. The display device as claimed in claim 8, wherein a material of the piezoelectric layer is a polymer material.

* * * * *